(12) United States Patent
Sutardja et al.

(10) Patent No.: US 7,839,906 B1
(45) Date of Patent: Nov. 23, 2010

(54) LASER POWER CONTROL IN AN OPTICAL DISC DRIVE

(75) Inventors: Pantas Sutardja, Los Gatos, CA (US); Christopher Painter, Longmont, CO (US)

(73) Assignee: Marvell International Ltd., Hamilton (BM)

( * ) Notice: Subject to any disclaimer, the term of this patent is extended or adjusted under 35 U.S.C. 154(b) by 687 days.

(21) Appl. No.: 11/810,666

(22) Filed: Jun. 6, 2007

Related U.S. Application Data

(60) Provisional application No. 60/811,502, filed on Jun. 7, 2006.

(51) Int. Cl.
*H01S 3/13* (2006.01)
(52) U.S. Cl. .............................. 372/29.011; 372/29.015; 372/29.02; 372/29.021; 372/31; 372/29.01
(58) Field of Classification Search ............ 372/20.011, 372/29.015, 29.02, 29.021, 31, 29.01
See application file for complete search history.

(56) References Cited

U.S. PATENT DOCUMENTS

| | | | | |
|---|---|---|---|---|
| 4,803,384 A | * | 2/1989 | Yamane et al. | 327/179 |
| 2001/0043534 A1 | * | 11/2001 | Gyo | 369/53.26 |
| 2005/0265182 A1 | * | 12/2005 | Liu et al. | 369/47.53 |

* cited by examiner

*Primary Examiner*—Minsun Harvey
*Assistant Examiner*—Kinam Park

(57) ABSTRACT

Exemplary embodiments provide a method and system for controlling laser power in an optical disc drive. The exemplary embodiment of a control system includes at least one control component for generating a control signal; a plant for generating a control output responsive to the control signal; and a dual feedback control loop coupled between the control output of the plant and the control component, the dual feedback control loop comprising a combination of a running optimal power control (ROPC) loop, and an automatic power control (APC) loop that run concurrently for generating respective feedback control signals that are input to the control component for generation of a combined control signal adjustment that is used at least in part to generate the control signal.

39 Claims, 6 Drawing Sheets

LASER POWER CONTROL IN AN OPTICAL DISC DRIVE

CROSS REFERENCE TO RELATED APPLICATION

This application claims the benefit under 35 USC 119(e) of Provisional Patent Application Ser. No. 60/811,502, filed Jun. 7, 2006, the disclosure thereof incorporated by reference herein in its entirety.

FIELD OF THE INVENTION

The present invention relates to optical recordable disc drives, and more particularly to a method and system for controlling laser power in an optical recordable disc drive.

BACKGROUND OF THE INVENTION

Optical discs, which may be used in computing, sound reproduction, and video, store data as information-bearing features, commonly referred to as marks that are formed within a recording layer of the disc. This data is both read and written by illuminating the recording layer with a semiconductor laser or laser diode of an optical recordable disc drive. If the data is written properly, such that the information-bearing marks burned into the recording layer by the laser are the correct length, and distance apart, then the disc should be interchangeable on any CD or DVD multi-play drive.

In general, the relationship between the total output power of a semiconductor laser and the current flowing though it is very sensitive to temperature and manufacturing variations, and to parameter drift due to aging of the laser. For example, the characteristics of a laser are highly dependent on the temperature of the laser chip. One important characteristic is the effect of temperature on the relationship between the diode's optical output and the current. In this case, the optical output decreases as the operating temperature increases and, conversely the optical output increases as the operating temperature decreases.

At the same time, the quality of the information-bearing marks written on the disc is directly related to the light power incident on the recording layer, which is, in turn, strongly influenced by various effects, including imperfections of the disc itself. For example, the characteristics of the recording disc may change with variations in ambient temperature and humidity. In addition, the surface of the disc may be uneven, scratched, or contain dust or a fingerprint. Due to such effects, some of the light produced by the laser may be scattered, and thus becomes unavailable to heat the recording layer appropriately.

Due to such variables, optical drive recorders typically define laser power as a range of values, rather than a fixed number, and include a control algorithm for adjusting and regulating the laser power when writing to a recordable optical disc. Known methods for regulating the laser power to achieve a stable optical output from the laser while writing include automatic power control (APC), and running optimal power control (ROPC).

APC provides a laser drive current based on a photodiode feedback loop that monitors the optical output of the laser, i.e., the light power, and provides a control signal for the laser that maintains operation at a constant optical output power level. The laser power is regulated based on information provided during disc writing by a sensing element called a front monitor diode (FMD). The FMD signal (also called the forward sense, or FS signal) is proportional to the total light power produced by the laser, and it is typically influenced by changes in laser parameters attributable to temperature drift, aging, and other effects.

ROPC regulates laser power based on the light reflected from the disc, rather than the light leaving the laser. The light reflection from the disc is monitored, and based on the detected reflection, the laser power is adjusted accordingly. When imperfections on the surface of the disc, such as scratches and fingerprints, scatter the light produced by the laser, ROPC is a more favorable means of regulating the light power than APC, since the light reflected from the disc is more directly related to the mark formation process. However, due to various system-level reasons, ROPC is hard to implement in a manner that consistently achieves the desired result. One reason is that ROPC customarily uses a sensor comprising an analog circuit to perform an absorption measurement. Performing the absorption measurement, however, in real time while the laser is writing to the disc at high speed requires a very precise and expensive analog circuit.

Accordingly, a need exists for an improved system and method for controlling laser power while writing a recordable optical disc.

BRIEF SUMMARY OF THE INVENTION

Exemplary embodiments provide a method and system for controlling laser power in an optical disc drive. The exemplary embodiment of a control system includes at least one control component for generating a control signal; a plant for generating a control output responsive to the control signal; and a dual feedback control loop coupled between the control output of the plant and the control component, the dual feedback control loop comprising a combination of a running optimal power control (ROPC) loop, and an automatic power control (APC) loop that run concurrently for generating respective feedback control signals that are input to the control component for generation of a combined control signal adjustment that is used at least in part to generate the control signal.

According to the method and system disclosed herein, the control system of the exemplary embodiment eliminates the disadvantage of laser control systems that only regulate laser output power based on outgoing light using APC. In accordance with the exemplary embodiment, in addition to regulating laser output power based on outgoing light, the laser power is also regulated based on the light reflected from the disc, which is proportional to the light that actually reaches the recording surface of the disc. The exemplary embodiments further ROPC and provide mechanisms that reduce contention for laser control between the APC and ROPC loops.

DETAILED DESCRIPTION OF THE INVENTION

The present invention relates to methods for controlling laser power in an optical disc drive. The following description is presented to enable one of ordinary skill in the art to make and use the invention and is provided in the context of a patent application and its requirements. Various modifications to the preferred embodiments and the generic principles and features described herein will be readily apparent to those skilled in the art. Thus, the present invention is not intended to be limited to the embodiments shown, but is to be accorded the widest scope consistent with the principles and features described herein.

Figure 1:
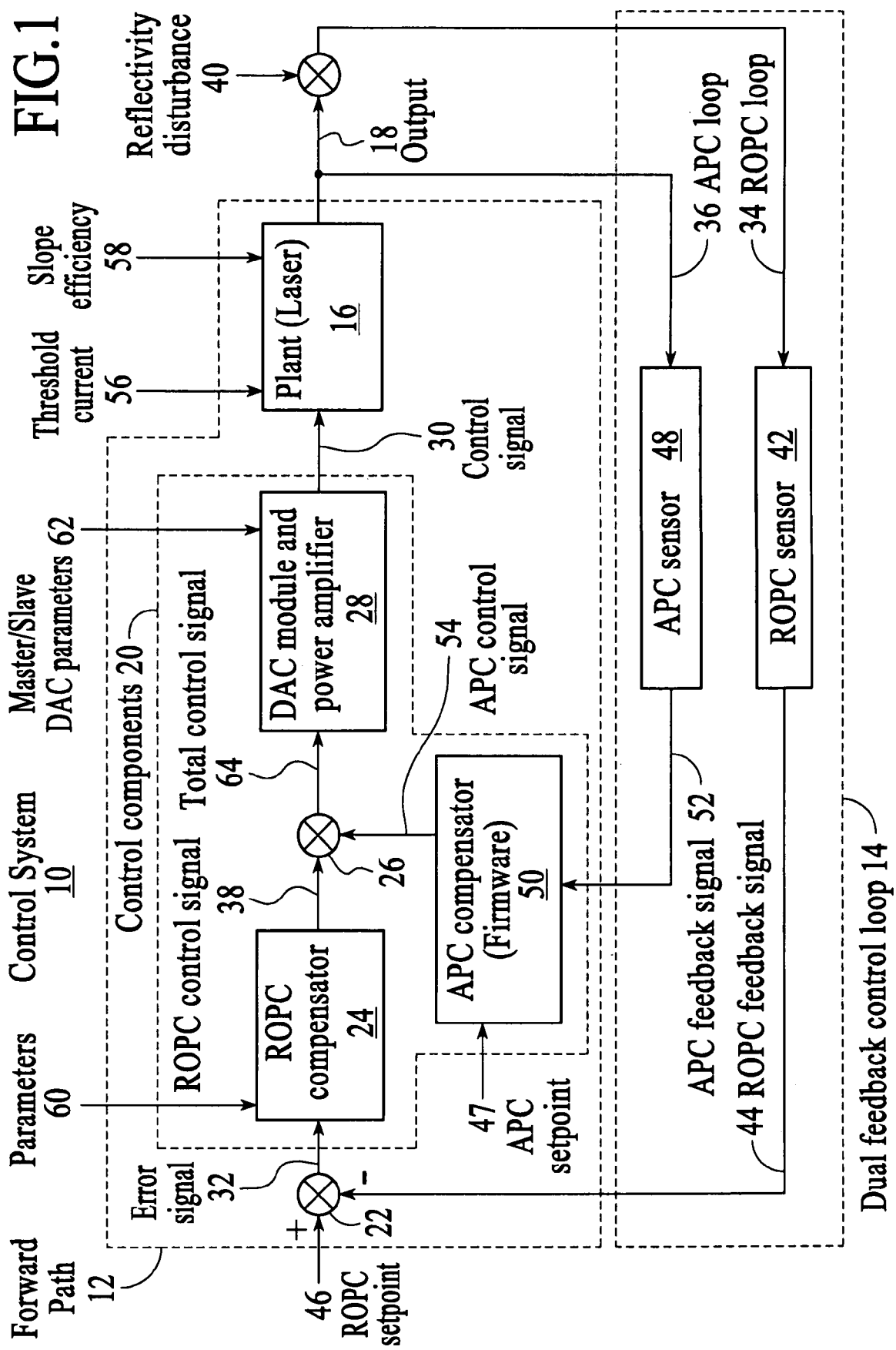
FIG. 1 is a diagram illustrating a laser control system for use in an optical disc drive that writes to an optical recordable disc.

FIG. 1 is a diagram illustrating a laser control system for use in an optical recordable disc drive that writes to an optical disc. The block diagram is a pictorial representation for characterizing functional relationships among various components of the laser control system 10. Components of the laser control system 10 are represented by blocks, and arrows between the blocks represent direction of information or control signal flow.

The laser control system 10 in one embodiment includes a forward path 12 coupled to a dual feedback control loop 14. The forward path 12 comprises a plant 16, control components 20, and a first summing point 22. The plant 16, which represents an object (e.g., a system, subsystem, or process), generates an output 18 under control of the dual feedback control loop 14. In one embodiment, the plant 16 represents a semiconductor laser (hereinafter referred to as the plant/laser 16), and the output 18 represents laser light generated by the laser. In the context of an optical recording and playback system, the laser light is most conveniently characterized in terms of its power or intensity at various locations in the optical path. For example, the power of the light leaving the objective lens is related to the total light power produced by the laser by an optical design parameter known as the light path efficiency. The light returning from the disc is related to the light exiting the objective lens by the effective reflectivity of the recording layer of the disc. Disc imperfections, such as scratches, dust or fingerprints reduce both the amount of light power incident on the recording layer of the disc, and the light power returning from the disc by scattering or absorbing light energy. Such effects are well represented as modulation or degradation of the effective reflectivity, shown in FIG. 1 as reflectivity disturbance 40.

The control components 20 represent components of the forward path 12 that are responsive to input signals received from the dual feedback loop 14 for generating a control signal 30 that is applied to the plant/laser 16. In one embodiment, the control signal 30 comprises current. The plant/laser 16 is responsive to the control signal 30 for generating the output 18.

Other physical parameters of the plant/laser 16 may also include values for a threshold current 56 and slope efficiency 58. The threshold current 56 defines the boundary between spontaneous emission and the stimulated emission of the control output 18 from the plant/laser 16. Below the threshold current 56, the output of the plant/laser 16 is incoherent; at or above the specified threshold current 56, the plant/laser 16 begins to produce the output 18. Once past the threshold point, stimulated emission is achieved and the optical output increases significantly for a small increase in the control signal 30. Slope efficiency 58 is the mean value of the incremental change in optical power for an incremental change in the control signal 30 applied to the plant/laser 16.

In accordance with one embodiment, the dual feedback control loop 14 comprises a combination of both a running optimal power control (ROPC) loop 34 and an automatic power control (APC) loop 36. The ROPC loop 34 and the APC loop 36 run concurrently and generate respective feedback control signals 44 and 52 that are input to the control components 20 for generation of a combined control signal adjustment, total control signal 64, which is used at least in part to generate the control signal 30 that is applied to the plant/laser 16.

Through the ROPC loop 34 and the APC loop 36, the dual feedback control loop 14 provides dual transmission paths between the output 18 of the plant/laser 16 and the control components 20. The control components 20 include an ROPC compensator 24, an APC compensator 50, a summing point 26, and a digital-to-analog converter (DAC)/power amplifier 28, which are explained below.

The APC loop 36 is used to correct laser output power to account for changes in laser efficiency changes due to drift in laser characteristics, such as temperature drift, while the ROPC loop 34 is used to regulate laser output power to account for changes in reflected laser power incident on the recording layer of the disc related to conditions of the disc (e.g., disc defects or imperfections or other undesirable effects that cannot be inferred from APC).

The ROPC and APC feedback signals 44 and 52 representing the output 18 from the plant/laser 16 are used for comparison with ROPC and APC setpoints 46 and 47 representing optimal or desired values for the control output 18 in order to generate the total control signal 64 as follows.

The ROPC loop 34 includes an ROPC sensor 42 that measures the amount of laser light reflected from the disc, and in response, produces an ROPC feedback signal 44. The ROPC sensor 42 may comprise a photodetector onto which some fraction of the laser light is redirected by an optical element (not shown). The photodetector may in turn, produce a current that is turned into a voltage, which is eventually turned into a sampled quantized number. The ROPC feedback signal 44, which is a function of the output 18, is input to summing point 22 and algebraically summed with the ROPC setpoint 46 representing the optimal or desired value for the amount of reflected light detected. In one embodiment, the ROPC feedback signal 44 is subtracted from the ROPC setpoint 46. The difference between the ROPC setpoint 46 and the ROPC feedback signal 44, as calculated by the summing point 22, is represented as error signal 32. The error signal 32, which eventually will be used to increase or decrease the output 18, is input to the ROPC compensator 24.

The ROPC compensator 24 is a linear or nonlinear filter that shapes the loop dynamics of the ROPC loop 34. The compensator uses the error signal 32 to calculate the ROPC control signal 38, which is the ROPC loop's contribution to the total control signal 64. Other parameters 60 may also be input to ROPC compensator 24. These may include, but are not limited to local feedback gains and other parameters that determine the static and dynamic characteristics of compensator. When the compensator is a linear filter, for example, these parameters might determine the locations of poles and zeros of the filter, and its DC or mid band gain.

APC provides a portion of the total laser drive current based on a photodiode feedback loop that monitors the optical output of the laser, i.e., the light power, and provides a control signal for the laser that maintains operation at a constant optical output power level. The APC loop 36 includes a sensor 48 that produces an APC feedback signal 52 representing the total output power of the plant/laser 16. According to one embodiment, the sensor 48 may comprise a front monitor diode (FMD) for generating the APC feedback signal 52 that is proportional to the total output power of the plant/laser 16. The APC feedback signal 52 is typically influenced by changes in laser parameters attributable to temperature drift, aging, and other effects. The APC feedback signal 52 is input to the APC compensator 50, which compares the output power as represented by the APC feedback signal 52 to the optimum or expected output power of the plant/laser 16 represented by the APC setpoint 47. In one embodiment, the APC compensator 50 is implemented in firmware, but in other embodiments, it might also be implemented using an analog circuit, or by some combination of analog and digital circuits. The difference between APC feedback signal 52 and the APC setpoint 47 is processed by the APC compensator 50, and eventually results in an APC control signal 54, which is input to summing point 26. The APC compensator 50 performs a linear filtering operation on the APC feedback signal 52. In other embodiments, the APC compensator 50 might as an alternative perform a nonlinear filtering operation on the APC feedback signal 52. The APC control signal 54 is the APC loop's contribution to the total control signal 64.

In response to receiving the ROPC control signal 38 and APC control signal 54, the summing point 26 algebraically sums the ROPC control signal 38 and APC control signal 54 to generate and output the total control signal 64.

The DAC/power amplifier 28 receives the total control signal 64 and converts it into the control signal 30 for driving the plant/laser 16. Other inputs to the DAC/power amplifier 28 include master/slave DAC and configuration data 62. In one embodiment, the master/slave DAC and configuration data 62 receives the total control signal 64, and in turn drives one or more slave DACs and associated power amplifier channels. As the write process proceeds, these channels are enabled in predefined combinations, and at precisely defined times, based on the information (mark/space pattern) to be written to the disc. The electronic circuit that controls the sequence in which the individual channels within the power amplifier are activated is known as the write strategy generator (not shown). The currents produced by the individual power amplifier channels are combined at the output of the power amplifier to produce the control signal 30. In this way, laser current waveforms of complex shape can be formed. The waveform shape most suitable for a particular disc type (e.g., CD-RW, DVD+R, etc.) is determined by the optical and thermal properties of the recording layer of that disc, as well as the speed at which the marks are written to the disc.

From FIG. 1 it is apparent that the control effort to the plant/laser 16 is provided jointly by the ROPC and APC loops 34 and 36 by way of the common DAC/power amplifier 28. One advantage of the dual feedback control loop 14 is that it eliminates the disadvantage of laser control systems that only regulate laser output power based on outgoing light using APC. In accordance with one embodiment, in addition to regulating laser output power based on outgoing light, the laser power is also regulated based on the light reflected from the disc, which is proportional to the light that actually reaches the recording surface of the disc.

Since some of the dual power-control feedback loop 14 is implemented in the firmware, the process takes place in discrete time. However, the control system 10 may also be implemented as a continuous (analog) feedback control system using some combination of active and passive electronic components.

The exemplary embodiments disclosed herein are applicable to any optical recordable disc drive. Example types of optical recordable disc drives include various kinds of compact discs (CD), digital versatile discs (DVD), and high definition DVD discs (HD), and Blu-ray Discs (BD). More specifically, the laser control structure may be used to write recordable once discs, such as CD-R, DVD-R, DVD+R, HD-R and BD-R, and rewritable (write, erase, write again) discs, such as CD-RW, DVD-RW, DVD+RW, DVD-RAM, and HD-RW, for example. The concepts and embodiments disclosed herein can also be extended to read-only disc mastering applications in which a short wavelength laser is employed to write the master disc eventually used to mass produce individual ROM discs.

Referring still to FIG. 1, one potential problem with the dual feedback control loop 14 is that the plant/laser 16 is being controlled by two control loops 34 and 36, and the feedback signals 44 and 52 generated by the respective sensors 42 and 48 are generally inconsistent. This could mean that when the ROPC loop 34 attempts to make a correction, the APC loop 36 may interpret the ROPC correction as a disturbance and attempt to correct the ROPC correction.

Since the two loops 34 and 36 jointly control the same plant/laser 16, there are several possible embodiments for preventing contention between the two.

According to one embodiment, the control system 10 is made configurable to reduce potential contention between the ROPC and APC loops 34 and 36 caused by the generally inconsistent feedback signals 44 and 52 generated by the respective sensors 42 and 48 in the ROPC and APC loops 34 and 36. This allows the ROPC and APC loops 34 and 36 to coexist with one another to achieve the goal providing a good recording (i.e., one that results in data read from the disc that matches what was intended during the write).

One embodiment for reducing possible contention between the ROPC and APC loops 34 and 36 is to divide the functions performed by the ROPC and APC loops 34 and 36 in the frequency domain to make the APC loop 36 responsible for correcting errors due to long-range, low-frequency drift, and to make the ROPC loop 34 responsible for correcting errors due to rapid transient disturbances. More specifically, the APC loop 36 is configured to remove any DC and low frequency errors related to temperature-related drift in the laser threshold current or slope efficiency, while the frequency response of the ROPC compensator 24 in the ROPC loop 34 is configured to respond primarily to high frequency disturbances caused by conditions of the optical disc, i.e., disturbances that are much higher frequency than those related to laser phenomenon.

Another embodiment for reducing possible contention between the ROPC and APC loops 34 and 36 is to configure the ROPC loop 34 such that a frequency response of the ROPC compensator 24 in the ROPC loop 34 is modified so as to extend down to DC. In this embodiment, the ROPC loop 34 is further configured to inform the APC loop 36 about the ROPC loop's contribution to the combined control signal adjustment, i.e., the total control signal 30, so that the APC does not respond to the ROPC loop's contribution, as described with respect to FIG. 3. Informing the APC loop 36 about the ROPC loop's contribution to the control signal 30 prevents the APC compensator 50 from responding to the ROPC error signal 32, which the APC compensator 50 would otherwise perceive to be a "disturbance." In one embodiment, an adaptive, rather than fixed, decoupling gain may be used to convey information about the ROPC loop's contribution to the APC loop 36.

Another embodiment for reducing possible contention between the ROPC and APC loops 34 and 36 is by providing ROPC compensator 24 with an integrator stage that is set up as a lossy integrator, rather than a lossless integrator, as described below with respect to FIG. 4. This is equivalent to a lowpass filter having a DC gain generally greater than one. The general idea is that the APC loop 36 effects Type I control to compensate for temperature-induced drift in the laser parameters, while the ROPC loop 34 performs simple proportional (Type 0) control.

Another embodiment is to simplify the ROPC Loop 34 by configuring the ROPC loop 34 to perform a reflectivity measurement, rather than a common absorption measurement, as described with reference to FIGS. 2A through 2D.

Figure 2A:
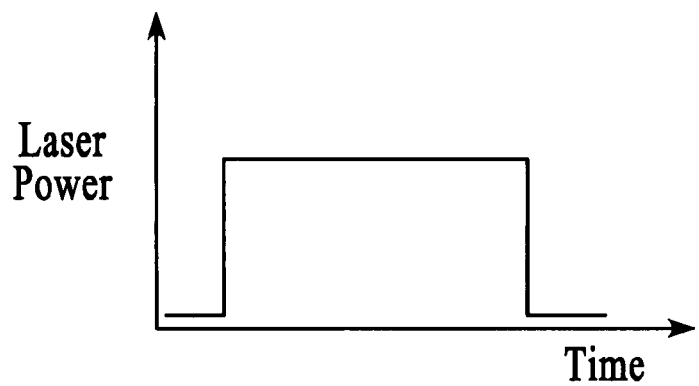
FIG. 2A is a graph of a waveform representing current (and therefore the laser power) flowing through the plant/laser while writing to a disc.

FIG. 2A is an idealized graph of a waveform representing current (and therefore the laser power) flowing through the plant/laser 16 while writing to a disc. The y-axis represents current/laser power, while the x-axis represents time. The graph is oversimplified, but is provided for the purposes of illustration. The waveform shape depends on the type of disc involved and the write speed, but typically a waveform has a complex shape having multiple power levels just to make a single mark on the disc during a write operation.

Figure 2B:
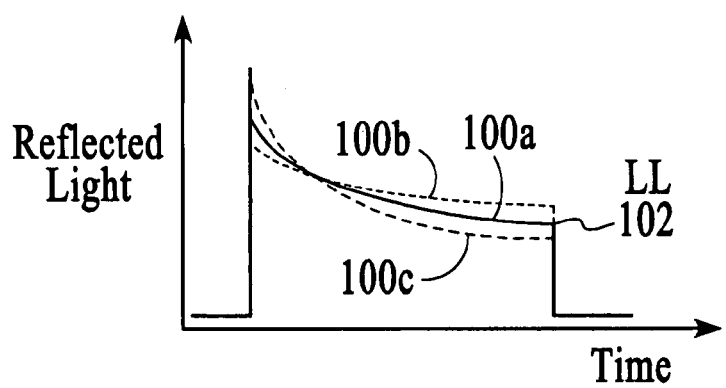
FIG. 2B is a graph depicting reflectivity curves representing changes in the amount of received light reflected from the disc over time.

FIG. 2B is a graph depicting reflectivity curves representing changes in the amount of received light reflected from the disc over time. Several reflectivity curves 100*a*, 100*b*, and 100*c* are depicted, which are collectively referred to as reflectivity curve 100. The shapes of the reflectivity curves 100 are typical of those resulting from a write to a record once "R" disc. The reflected light is not proportional to the current/laser power because of thermal properties. As time goes on during the write operation, the local temperature of the recording layer of the disc increases, and the reflectivity of the disc materials tends downward until it reaches a lower level 102 until the recording layer of the disc is burned or ablated, or melted in the case of RW disc. Reflectively curve 100*a* represents the amount of reflected light received with an optimal write laser power. Reflectivity curve 102*b* represents the amount of reflected light received when the write laser power is too low. And reflectivity curve 100*c* represents the amount of reflected light received when the laser power is too high. The lower level 102, as well as other points along the reflectivity curve 100, may be obtained by converting the reflected light from the optical disc into an electrical signal during the write operation.

Figure 2C:
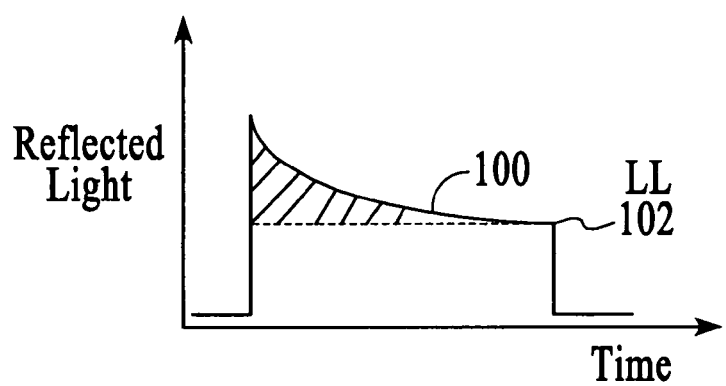
FIG. 2C is a graph illustrating a conventional absorption measurement performed by a conventional ROPC reflectivity curve.

Conventional ROPC loops determine if the laser power is too high or low by calculating the area under the reflectivity curve 100, which is referred to as an absorption measurement. FIG. 2C is a graph illustrating an absorption measurement performed by a conventional ROPC reflectivity curve 100. The calculation of the area under the reflectivity curve 100 is shown by the cross-hatching. If the calculated area is larger than a predetermined threshold, then it is determined that too much current/power is being input to the laser. If the calculated area is smaller than a predetermined threshold, then it is determined that too little current/power is being input to the laser. This is referred to as an absorption measurement because the area under the curve is proportional to how much light energy is absorbed by the disc materials. It typically takes a very precise and sophisticated analog circuit to calculate this area in real-time while the laser writing to the disc at high speed.

Figure 2D:
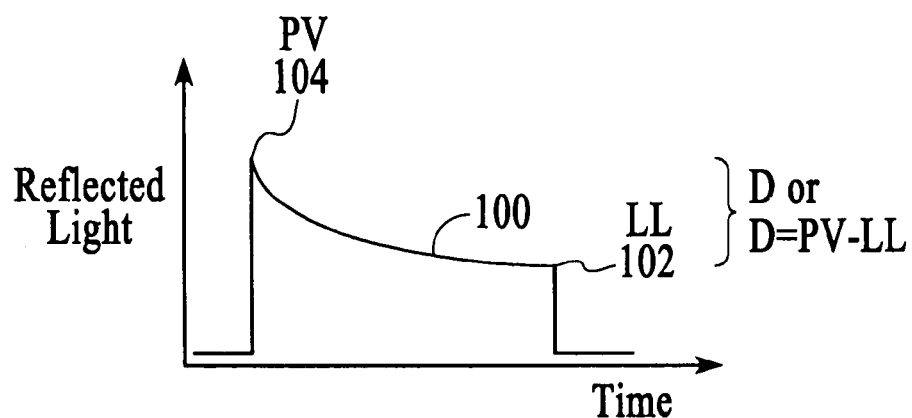
FIG. 2D is a diagram illustrating the reflectivity measurement of the one embodiment performed on the reflectivity curve.

According to another embodiment, the ROPC loop 34 is configured such that it performs a reflectivity measurement, rather than a common absorption measurement. FIG. 2D is a diagram illustrating the reflectivity measurement performed on the reflectivity curve. The reflectivity measurement is achieved by examining only a peak value 104 along the reflectivity curve 100, or by examining the difference between the peak value 104 and the lower level 102 on the reflectivity curve 102. If the peak value 102 or the difference is larger than a predetermined threshold, then it is determined that too much current/power is being input to the laser, and the current/power is reduced. If the peak value or the difference between the peak value and the lower level is smaller than a predetermined threshold, then it is determined that too little current/power is being input to the laser, and the current/power is increased. By examining the reflectivity curve 100 in this manner, it becomes not so much as an absorption measurement anymore, but a reflectivity measurement.

Figure 3:
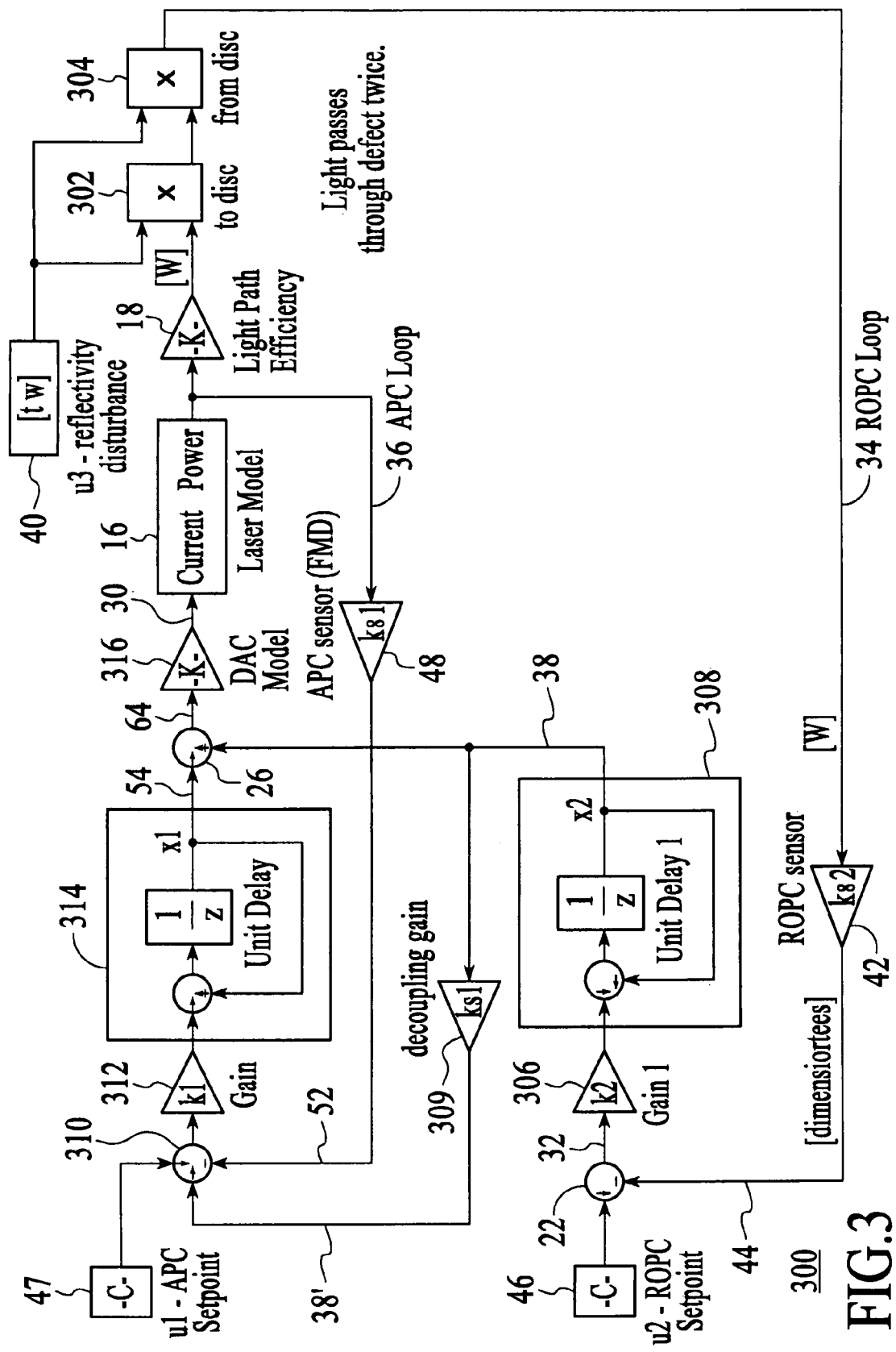
FIG. 3 is a diagram illustrating one embodiment of a laser control system for combining and decoupling the ROPC and APC control loops.

FIG. 3 is a diagram illustrating an embodiment of a laser control system 300 for combining and decoupling the ROPC and APC control loops 34 and 36, where like components from FIG. 1 have like reference numerals. As stated above, in one embodiment, the RPC and APC control loops 34 and 36 may be decoupled in one of several ways. One is to decouple the loops in the frequency domain, while the second is to extend the frequency range of the RPC loop 34 to cover low-frequency disturbances, thus overlapping figures the range of the APC loop 36. What is shown in FIG. 3 is an embodiment for the latter in which the frequency range of the ROPC loop spans that of the APC loop 36, but the ROPC loop 34 is configured to inform the APC loop 36 about the ROPC loop's contribution to the combined control signal 30 so that the APC loop 36 does not attempt to correct the RPC loop's contribution.

The control system 300 is similar to that shown in FIG. 1 where the plant/laser 16 receives the control signal 30 as a current, and in response, generates output 18 as laser light. While writing to the optical disc (not shown), the output/light 18 is modeled as passing through reflectivity disturbance 40 on the disc in box 302. The output/light 18 passes through the reflectivity disturbance 40 a second time when reflected back from the disc in box 304. The reflected light is detected by ROPC sensor 42 in the ROPC loop 34, and the ROPC feedback signal 44 is algebraically summed with the ROPC setpoint 46 by the summing point 22. The resulting error signal 32 is adjusted by gain 306, accumulated by accumulator 308, and then input to summing node 26 as the ROPC control signal 38.

Similarly, the output power of the plant/laser 16 is detected by the APC sensor 48 and is input to the summing point 310 (e.g., the APC compensator 50) as the APC feedback signal 52. However, in this embodiment, the ROPC control signal 38 is adjusted by gain 309, creating a scaled ROPC control signal 38', and the scaled ROPC control signal 38' is also input to the summing point 310. The summing point 310 subtracts the APC feedback signal 52 from the APC setpoint 47, and adds to the result the scaled ROPC control signal 38'. The output of the summing point 310 is adjusted by gain 312, accumulated by accumulator 314, and then input to summing node 26 as the APC control signal 54. The summing point 26 algebraically sums the ROPC control signal 38 and APC control signal 54 to generate and output the total control signal 64, which is adjusted by gain 316 (e.g., the combined gains of the DAC module and power amplifier 28) to generate the control signal 30 that is applied to the plant/laser 16.

Feeding the ROPC control signal 38 back into the error signal of the APC loop 36 effectively decouples the two loops 34 and 36 because the potential disturbance caused by the ROPC loop's contribution is used to dynamically adjust the setpoint of the APC loop. The effective APC setpoint at any instant is the sum of the original APC setpoint and the scaled ROPC control signal 38'.

Figure 4:
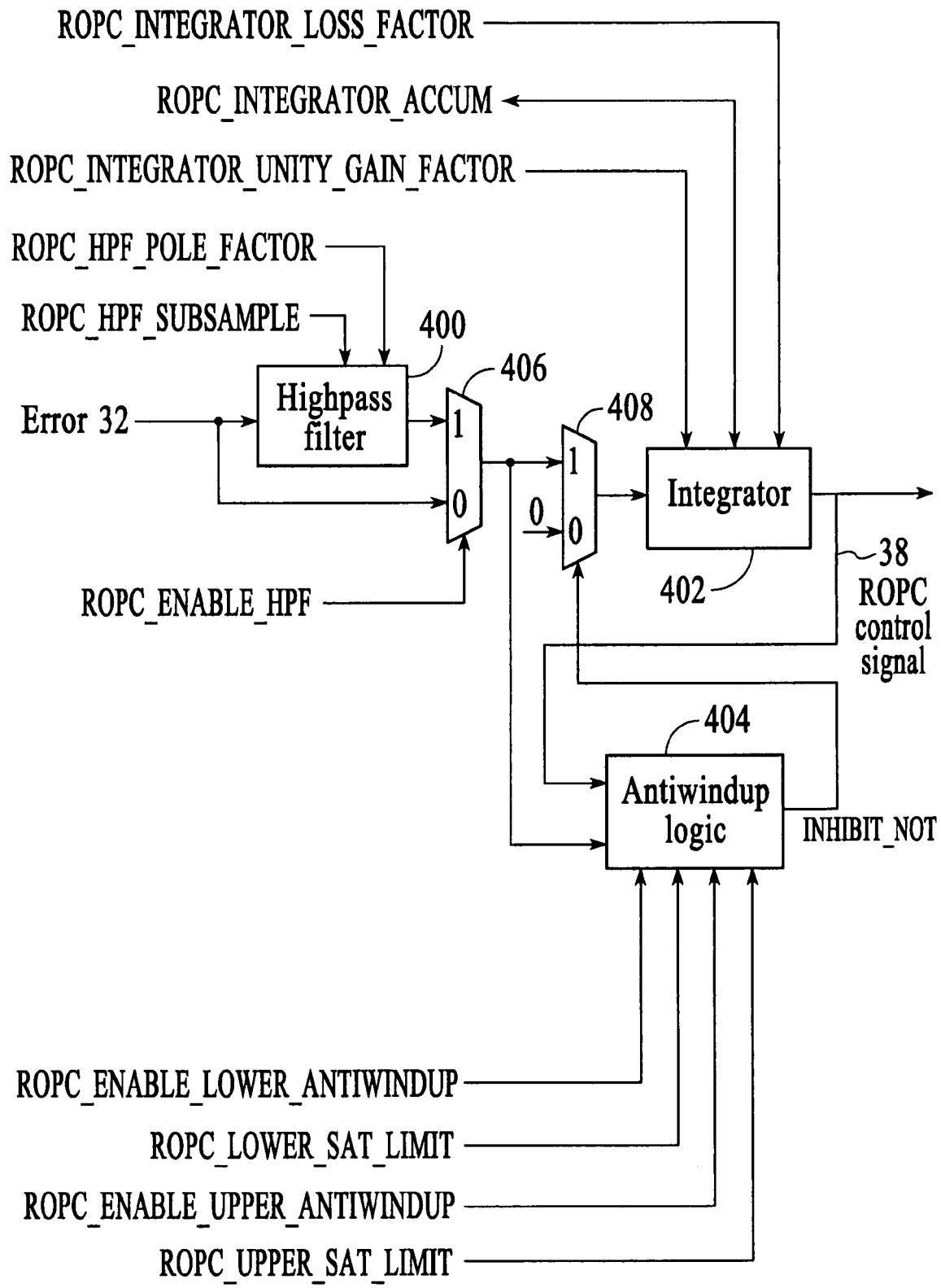
FIG. 4 is a diagram illustrating the ROPC compensator in further detail.
Figure 5:
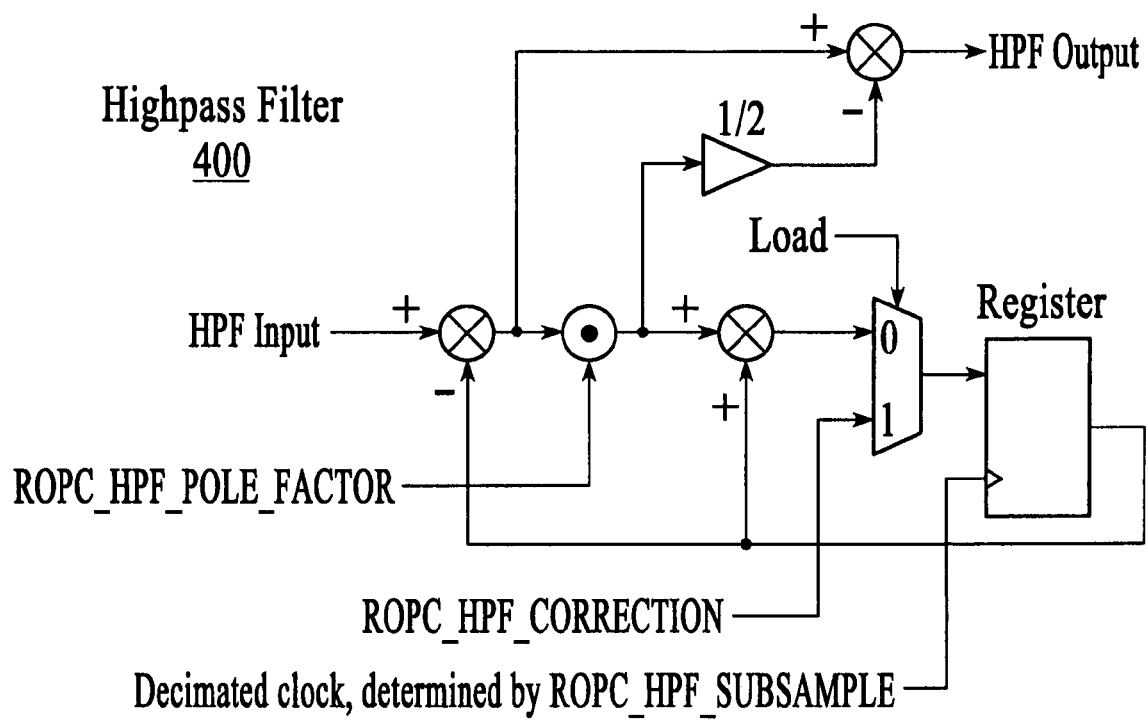
FIG. 5 is a block diagram illustrating one hardware embodiment for implementing a ROPC high pass filter in accordance with one embodiment.
Figure 6:
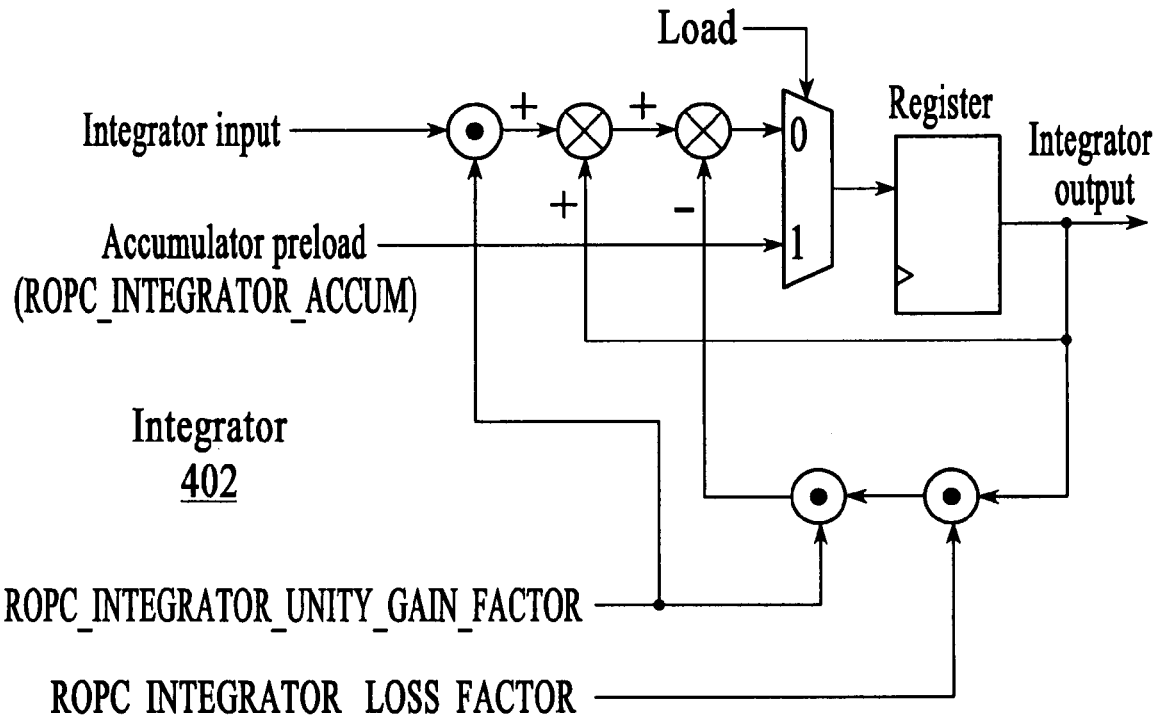
FIG. 6 is a block diagram of the lossy/lossless integrator of the ROPC compensator in accordance with one embodiment.

The ROPC compensator 24 of FIG. 1 is shown in further detail in FIGS. 4, 5, and 6 in accordance with other embodiments. FIG. 4 shows that in one embodiment, ROPC compensator 24 may include three discrete time blocks: a highpass filter (HPF) 400, an integrator 402, and anti-windup logic 404. Two multiplexers 406 and 408 are coupled in series between the highpass filter 400, the integrator 402 and the anti-windup logic 404.

The function of the high pass filter 400 is to allow configuration of the frequency range of the ROPC loop 34 for as one possible means of decoupling the ROPC and APC loops 34 and 36. Inputs to the highpass filter 400 include the error signal 32, and the ROPC HPF sampling rate selection parameter (ROPC_HPF_SUBSAMPLE), and an ROPC pole factor that sets the location of the corner frequency of the highpass filter 400. Based on the value of the ROPC HPF enable signal, the Multiplexer 406 either passes the output of the high pass filter 400, or passes the error signal 32 to bypass the high pass filter 400.

The integrator 402 integrates the error signal 32 over time to produce the ROPC control signal 38 as a correction for the error signal 32 so as to continually drive the error signal 32 toward zero. In this way, static or DC errors are eliminated entirely. The effects of dynamic or time-varying errors are greatly reduced, but not eliminated, by this simple control structure. The scope of this invention is exemplified by, but not limited to, the structure shown in FIG. 4. Other more elaborate control structures (not shown) are also possible which give improved attenuation of dynamic disturbances. The integrator 402 is preferably configured to maintain its output at whatever value is needed to keep the error signal 32 at zero, thereby implementing a lossless integrator. Another means of minimizing interaction between the APC and ROPC loops is to instead utilize a lossy integrator. This is equivalent to a lowpass filter having a DC gain generally greater than one. Inputs to the integrator 402 in one embodiment include ROPC integrator loss factor, and an ROPC integrator unity gain factor that scales the output, and thereby influences the bandwidth of the ROPC control loop. The current state of the ROPC accumulator (ROPC_INTEGRATOR_ACCUM) can optionally be read by the firmware.

The control strategies enumerated above for preventing contention between the ROPC and APC loops 34 and 36 can therefore be implemented by choosing various high pass filter 400 and integrator 402 configurations. For example, the control strategy whereby the ROPC compensator 24 is set up so that it responds only to high-frequency disturbances can be implemented by enabling the high pass filter 400 and using a lossy integrator. The companion APC compensator 50 in this case might for example implement integral (I) or perhaps PI (proportional plus integral) control. Many other control strategies are possible within scope of this invention. For example, the HPF plus lossy/lossless integrator described above may be generalized to include other classes of linear and nonlinear compensators. Thus, the ROPC compensator 24 may be implemented as some combination of linear and memory less nonlinear elements, or nonlinear elements having memory. Another example would be a linear time-varying compensator structure that adapts its dynamical behavior to compensate for, or to track, changes in write speed, as might occur during constant angular velocity (CAV) writing.

If a large reflectivity disturbance 40 is encountered, the integrator 402 may "windup" or produce an overcorrection. In accordance with one embodiment, the compensator is provided with the anti-windup logic 404 to prevent the integrator 402 from overreacting in response to a large reflectivity disturbance 40. The anti-windup logic 404 gates the error to zero if the logic is active, otherwise the anti-windup logic 404 passes the control error 32 through to be integrated. Inputs to the anti-windup logic 404 include ROPC enable upper and lower values, and ROPC lower and upper saturation limits.

Figure 7:
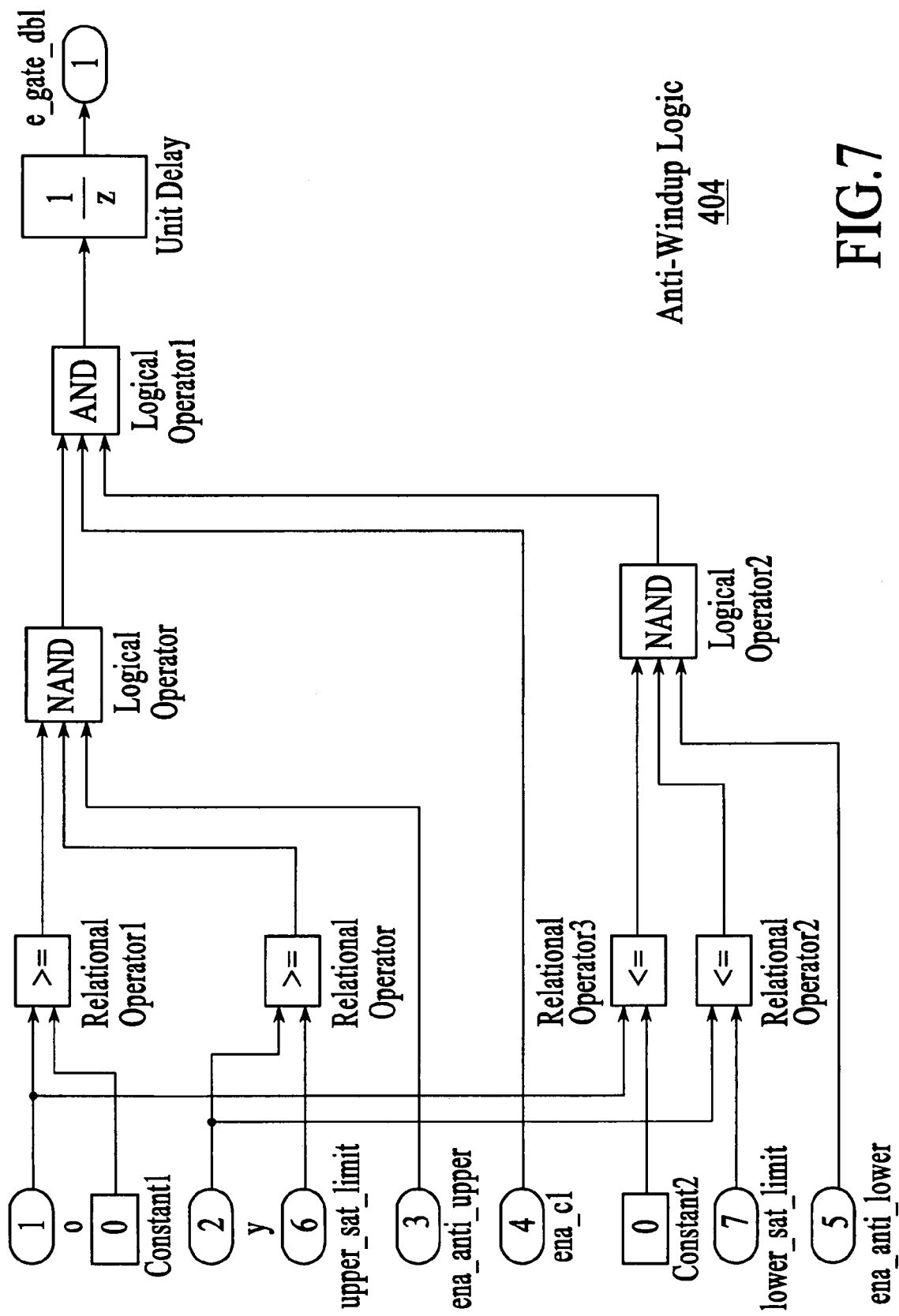
FIG. 7 is a block diagram of the anti-windup logic of the ROPC compensator in accordance with one embodiment.

FIG. 5 is a block diagram illustrating one hardware embodiment for implementing the ROPC high pass filter 400 in accordance with one embodiment. FIG. 6 is a block diagram of the lossy/lossless integrator 402 of the ROPC compensator 24 in accordance with one embodiment. FIG. 7 is a block diagram of the anti-windup logic 404 of the ROPC compensator 24 in accordance with one embodiment. The embodiments shown in FIGS. 5, 6 and 7 are illustrated as specific embodiments, but one of ordinary skill in the art will readily recognize that the high pass filter 400, integrator 402, and anti-windup logic 404 could be implemented using many other hardware configurations.

A method and system for providing a control system for controlling output power of a plant has been disclosed. The control system of the exemplary embodiment eliminates the disadvantage of control systems that only regulate output power using APC, simplifies ROPC, and provides mechanisms that reduce contention for plant control between the APC and ROPC loops. The control system may be used advantageously as a control strategy for improving the quality or integrity of features written to a recording layer of an optical disc by an optical disk drive, including to production of masters used in mass production of read-only discs.

The present invention has been described in accordance with the embodiments shown, and one of ordinary skill in the art will readily recognize that there could be variations to the embodiments, and any variations would be within the spirit and scope of the present invention. For example, the present invention can be implemented using hardware, software, a computer readable medium containing program instructions, or a combination thereof. Software written according to the present invention is to be either stored in some form of computer-readable medium such as memory or CD-ROM, or is to be transmitted over a network, and is to be executed by a processor. Consequently, a computer-readable medium is intended to include a computer readable signal, which may be, for example, transmitted over a network. Accordingly, many modifications may be made by one of ordinary skill in the art without departing from the spirit and scope of the appended claims.

We claim:

1. A control system, comprising:
   a control component configured to generate a control signal;
   a plant configured to generate an output responsive to the control signal; and
   a dual feedback control loop coupled between the output of the plant and the control component, the dual feedback control loop comprising a combination of (i) a running optimal power control (ROPC) loop and (ii) an automatic power control (APC) loop, wherein the ROPC loop and the APC loop run concurrently to generate respective feedback control signals that are input to the control component for generation of a combined control signal adjustment, the combined control signal adjustment being used at least in part to generate the control signal, wherein potential contention between the ROPC loop and the APC loop is reduced by configuring the ROPC loop to have a frequency response that extends to DC, and configuring the ROPC loop to inform the APC loop about contribution of the ROPC loop to the combined control signal adjustment so that the APC loop does not respond to the contribution of the ROPC loop.

2. The control system of claim 1, wherein the plant comprises a laser, and the output comprises laser light.

3. An optical disc drive comprising the control system of claim 2.

4. The control system of claim 2, wherein the APC loop is used to correct laser output power to account for changes in laser efficiency due to (i) drift in laser characteristics and (ii) temperature drift.

5. The control system of claim 2, wherein the ROPC loop is used to regulate laser output power to account for changes in laser power incident on a recording layer of an optical disc related to conditions of the disc as determined by an amount of laser light reflected from the disc, wherein the conditions of the disc include disc defects.

6. The control system of claim 5, wherein the ROPC loop is configured such that the ROPC loop performs a reflectivity measurement, rather than an absorption measurement.

7. The control system of claim 6, wherein the ROPC loop performs the reflectivity measurement by:

examining only a peak value along a reflectivity curve of reflected laser light received; or examining a difference between the peak value and a lower level on the reflectivity curve.

8. The control system of claim 1, wherein the potential contention between the ROPC loop and the APC loop is reduced by (i) configuring the APC loop to remove DC and low-frequency errors related to temperature-related drift, and (ii) configuring the ROPC loop to respond to high frequency disturbances caused by conditions of an optical disc.

9. The control system of claim 1, wherein an adaptive decoupling gain is used to convey information about the contribution of the ROPC loop to the APC loop.

10. The control system of claim 1, wherein the frequency response of the ROPC loop is configurable through a compensator, wherein the compensator comprises a high pass filter and an integrator.

11. The control system of claim 10, wherein the potential contention between the ROPC loop and the APC loop is reduced by providing the compensator with an integrator stage that is set up as a lossy integrator.

12. The control system of claim 11, wherein the compensator further comprises anti-wind up logic configured to prevent the integrator from overreacting in response to a large reflectivity disturbance.

13. The control system of claim 1, wherein the control component comprises:

a ROPC compensator responsive to the ROPC loop, the ROPC compensator configured to generate an ROPC control signal; and an APC compensator responsive to the APC loop, the APC compensator configured to generate an APC control signal.

14. The control system of claim 13, wherein the APC compensator is implemented as firmware.

15. The control system of claim 13, wherein the control component further comprises a summing point for summing the ROPC control signal and the APC control signal to generate and output the combined control signal adjustment as a total control signal.

16. The control system of claim 15, wherein the frequency response of the ROPC loop is configurable through the compensator.

17. The control system of claim 16, wherein the compensator comprises a high pass filter and an integrator.

18. The control system of claim 17, wherein the integrator is configurable to be lossy or lossless.

19. A method for controlling a control output of a plant, the method comprising:

generating a control signal a control component;

generating an output from the plant responsive to the control signal;

providing a dual feedback control loop between the output of the plant and the control component, the dual feedback control loop comprising a combination of (i) a running optimal power control (ROPC) loop and (ii) an automatic power control (APC) loop, wherein the ROPC loop and the APC loop run concurrently for generating respective feedback control signals that are input to the control component for generation of a combined control signal adjustment, the combined control signal adjustment being used at least in part to generate the control signal; and reducing potential contention between the ROPC loop and the APC loop by:

configuring the ROPC loop to have a frequency response that extends to DC, and configuring the ROPC loop to inform the APC loop about contribution of the ROPC loop to the combined control signal adjustment so that the APC loop does not respond to the contribution of the ROPC loop.

20. The method of claim 19, wherein the plant comprises a laser, and the control output comprises laser light.

21. The method of claim 20, wherein the APC loop is used to correct laser output power to account for changes in laser efficiency due to (i) drift in laser characteristics, and (ii) temperature drift.

22. The method of claim 20, wherein the ROPC loop is used to regulate laser output power to account for changes in laser power incident on a recording layer of an optical disc related to conditions of the disc as determined by an amount of laser light reflected from the disc, wherein the conditions of the disc include disc defects.

23. The method of claim 21, wherein the ROPC loop is configured to perform a reflectivity measurement, rather than an absorption measurement.

24. The method of claim 23, wherein the ROPC loop performs the reflectivity measurement by:

examining only a peak value along a reflectivity curve of reflected laser light received; or examining a difference between the peak value and a lower level on the reflectivity curve.

25. The method of claim 19, wherein the potential contention between the ROPC loop and the APC loop is reduced by (i) configuring the APC loop to remove DC and low-frequency errors related to temperature-related drift, and (ii) configuring the ROPC loop to respond to high frequency disturbances caused by conditions of an optical disc.

26. The method of claim 19, further comprising using an adaptive decoupling gain to convey information about the contribution of the ROPC loop to the APC loop.

27. The method of claim 19, wherein the frequency response of the ROPC loop is configurable through a compensator, wherein the compensator comprises a high pass filter and an integrator.

28. The method of claim 27, wherein the potential contention between the ROPC loop and the APC loop is reduced by providing the compensator with an integrator stage that is set up as a lossy integrator.

29. The method of claim 28, wherein the compensator further comprises anti-wind up logic configured to prevent the integrator from overreacting in response to a large reflectivity disturbance.

30. The method of claim 19, wherein the control component comprises:
   a ROPC compensator responsive to the ROPC loop, the ROPC compensator configured to generate an ROPC control signal; and
   an APC compensator responsive to the APC loop, the APC compensator configured to generate an APC control signal.

31. The method of claim 30, further comprising implementing the APC compensator as firmware.

32. The method of claim 30, wherein the control component further comprises a summing point for summing the ROPC control signal and the APC control signal to generate and output the combined control signal adjustment as a total control signal.

33. The method of claim 32, wherein the frequency response of the ROPC loop is configurable through the compensator.

34. The method of claim 33, wherein the compensator comprises a high pass filter and an integrator.

35. The method of claim 34, wherein the integrator is configurable to be lossy or lossless.

36. A control system, comprising:
   at least one control component configured to generate a control signal;
   a plant configured to generate an output responsive to the control signal; and
   a dual feedback control loop coupled between the output of the plant and the control component, the dual feedback control loop comprising (i) a running optimal power control (ROPC) loop and (ii) an automatic power control (APC) loop each configured to generate respective feedback control signals that are input to the control component for generation of a combined control signal adjustment the combined control signal adjustment being used at least in part to generate the control signal,
   wherein the control component comprises a ROPC compensator responsive to the ROPC loop and an APC compensator responsive to the APC loop,
   wherein the ROPC compensator is configured to generate an ROPC control signal, and the APC compensator is configured to generate an APC control signal, and
   wherein the control component is configured to add the ROPC control signal and the APC control signal to generate and output the combined control signal adjustment.

37. The control system of claim 36, wherein a frequency response of the ROPC loop is configurable through the compensator.

38. The control system of claim 37, wherein the compensator comprises a high pass filter and an integrator.

39. The control system of claim 38, wherein the integrator is configurable to be lossy.

* * * * *